United States Patent
Chassaing et al.

(10) Patent No.: US 8,920,624 B2
(45) Date of Patent: Dec. 30, 2014

(54) METHOD FOR PREPARING AN ABSORBER THIN FILM FOR PHOTOVOLTAIC CELLS

(75) Inventors: Elisabeth Chassaing, Paray-Vieille-Poste (FR); Daniel Lincot, Antony (FR)

(73) Assignees: Electricite de France, Paris (FR); Centre National de la Recherche Scientifique—CNRS—, Paris Cedex (FR)

( * ) Notice: Subject to any disclaimer, the term of this patent is extended or adjusted under 35 U.S.C. 154(b) by 162 days.

(21) Appl. No.: 13/583,718

(22) PCT Filed: Feb. 17, 2011

(86) PCT No.: PCT/FR2011/050345
§ 371 (c)(1),
(2), (4) Date: Sep. 10, 2012

(87) PCT Pub. No.: WO2011/110763
PCT Pub. Date: Sep. 15, 2011

(65) Prior Publication Data
US 2013/0005074 A1    Jan. 3, 2013

(30) Foreign Application Priority Data

Mar. 11, 2010   (FR) .................................. 10 51769

(51) Int. Cl.
| | |
|---|---|
| *C25D 5/50* | (2006.01) |
| *C25D 9/08* | (2006.01) |
| *H01L 31/0749* | (2012.01) |
| *C25D 3/58* | (2006.01) |
| *H01L 31/032* | (2006.01) |
| *C25D 3/56* | (2006.01) |

(52) U.S. Cl.
CPC .............. *C25D 3/56* (2013.01); *H01L 31/0749* (2013.01); *C25D 3/58* (2013.01); *C25D 9/08* (2013.01); *H01L 31/0322* (2013.01); *Y02E 10/541* (2013.01)
USPC .......................................... 205/224; 205/333

(58) Field of Classification Search
USPC ................................................. 205/224, 333
See application file for complete search history.

(56) References Cited

U.S. PATENT DOCUMENTS

| 4,581,108 A | 4/1986 | Kapur et al. |
| 5,695,627 A | 12/1997 | Nakazawa et al. |

(Continued)

FOREIGN PATENT DOCUMENTS

| DE | 196 30 321 A1 | 1/1997 |
| EP | 0 574 716 A1 | 12/1993 |

(Continued)

OTHER PUBLICATIONS

Aksu et al., "Electrodeposition of Cu—In—Ga Films for the Preparation of CIGS Solar Cells" Photovoltaic Specialists Conference (PVSC), 2010 35th IEEE, Issue Date: Jun. 20-25, 2010.*

(Continued)

*Primary Examiner* — Bryan D. Ripa
(74) *Attorney, Agent, or Firm* — Drinker Biddle & Reath LLP

(57) ABSTRACT

A method for preparing an $A\text{-}B\text{-}C_2$ or $A_2\text{-}(D_x,E_{1-x})\text{-}C_4$ absorber thin film for photovoltaic cells where $0 \leq x \leq 1$, A is an element or mixture of elements selected within Group 11, B is an element or mixture of elements selected within Group 13, C is an element or mixture of elements selected within Group 16, D is an element or mixture of elements selected within Group 12, and E is an element or mixture of elements selected within Group 14. Said method includes: a step of electrochemically depositing oxide from elements selected from among Groups 11, 12, 13, and 14, a step of annealing in a reducing atmosphere, and a step of supplying an element from Group 16.

12 Claims, 3 Drawing Sheets

(56) References Cited

U.S. PATENT DOCUMENTS

| | | | | |
|---|---|---|---|---|
| 5,804,054 | A | * | 9/1998 | Bhattacharya et al. ....... 205/239 |
| 6,821,559 | B2 | * | 11/2004 | Eberspacher et al. ........ 427/226 |
| 2006/0121701 | A1 | * | 6/2006 | Basol ............................ 438/483 |
| 2006/0151331 | A1 | * | 7/2006 | Taunier et al. ................ 205/316 |

FOREIGN PATENT DOCUMENTS

| | | |
|---|---|---|
| GB | 2 370 282 A | 6/2002 |
| WO | WO 2004/061924 A1 | 7/2004 |
| WO | WO 2007/041650 A1 | 4/2007 |

OTHER PUBLICATIONS

Yukawa et al., "Electrodeposition of $CuInS_2$ from aqueous solution (II) Electrodeposition of $CuInS_2$ film," Thin Solid Films, Elsevier-Sequoia S.A. Lausanne, CH, vol. 286 (1/02), pp. 151-153 (Sep. 30, 1996).

Lai et al., "Preparation and characterization of $Cu(In, Ga)(Se, S)_2$ thin films by sulfurization of electrodeposited $Cu(In, Ga) Se_2$ precursors," Acta Physica Sinica, vol. 59(2), pp. 1196-1200 (Feb., 2010).

English Translation of Office Action issued for CN 201180023943.0 (Oct. 11, 2014).

* cited by examiner

METHOD FOR PREPARING AN ABSORBER THIN FILM FOR PHOTOVOLTAIC CELLS

CROSS-REFERENCE TO RELATED APPLICATIONS

This application is the U.S. national phase of the International Patent Application No. PCT/FR2011/050345 filed Feb. 17, 2011, which claims the benefit of French Application No. 10 51769 filed Mar. 11, 2010, the entire content of which is incorporated herein by reference.

FIELD

The present invention relates to the manufacture of photovoltaic cells, in particular for converting solar energy to electrical energy. More particularly, the present invention relates to a method for preparing an absorber thin film for photovoltaic cells and to a method for manufacturing a solar cell comprising an absorber thin film prepared according to the invention.

BACKGROUND

Photovoltaic cells often have a structure including a stack of thin films in which at least one of said thin films has photovoltaic properties.

An example of a structure of photovoltaic cells is shown in FIG. 1.

As shown in FIG. 1, a photovoltaic cell generally has a stack of films placed on an insulating support 12. In general, the insulating support 12 is a layer of glass.

A film of molybdenum 14 having a thickness of between 0.5 μm and 1 μm is deposited on the insulating support 12. The molybdenum film 14 is generally deposited by vacuum evaporation or sputtering.

An absorber film 16 is deposited on the molybdenum film 14. The absorber film 16 generally has a thickness of about 2 microns and may be deposited by vacuum evaporation, or by cathode sputtering.

An interfacial film 18 is deposited on the absorber film 16. The interfacial film 18, also called buffer film, may comprise cadmium sulfide or zinc sulfide deposited chemically in solution. The interfacial film 18 generally has a thickness of between 10 nm and 80 nm.

A slightly doped zinc oxide film 20 is deposited by cathode sputtering on the interfacial film 18. The slightly doped zinc oxide film 20 has a thickness of about 50 nm to 100 nm.

An aluminum-doped zinc oxide film 22 is deposited on the slightly doped zinc oxide film 20. The aluminum-doped zinc oxide film 22 is conventionally deposited by vacuum sputtering in order to have a thickness of about 0.5 μm to 1 μm.

The doping of the said zinc oxide film is intended to make said film n-type conductive and to serve as an electrode (transparent in the visible) at the front of the photovoltaic cell.

Photovoltaic cells in which the absorber film 16 consists of $CuInSe_2$ or $Cu(In_x,Ga_{1-x})Se_2$ compounds have conversion efficiencies of up to 20%.

The principal method for preparing photovoltaic cells in thin films makes use of physical methods, for example co-evaporation or even cathode sputtering.

The photovoltaic properties of the $CuInSe_2$ or $Cu(In_x,Ga_{1-x})Se_2$ thin films are considerably dependent on the composition of the absorber thin film. Thus, it is important to be able to control the composition of the absorber thin film as accurately as possible.

Electrodeposition is a method which can serve to improve the control of the composition of the $CuInSe_2$ or $Cu(In_x,Ga_{1-x})Se_2$ thin films.

A method for electrodepositing a $CuInSe_2$ alloy is described in application U.S. Pat. No. 4,581,108.

The method described in application U.S. Pat. No. 4,581,108 comprises the following successive steps:
  electrodepositing a thin film of copper (Cu) and indium (In),
  addition of selenium (Se) by selenization in order to form a $CuInSe_2$ film.

The preparation of an absorber thin film by electrodeposition is complicated to implement, inter alia, because of:
  the very wide difference in redox potentials of the various constituent elements of the thin film,
  the low solubility of indium and/or gallium salts,
  the strong affinity of gallium for oxygen, and
  the great complexity of selenium chemistry.

A need therefore exists for an easily applicable method for producing absorber films having a well controlled composition.

SUMMARY

The invention thus proposes a method for preparing an $A-B-C_2$ or $A_2-(D_x,E_{1-x})-C_4$ absorber thin film for photovoltaic cells where $0 \leq x \leq 1$, A is an element or a mixture of elements selected from group 11, B is an element or a mixture of elements selected from group 13, C is an element or a mixture of elements selected from group 16, D is an element or a mixture of elements selected from group 12 and E is an element or a mixture of elements selected from group 14, said method comprising the following successive steps:
  electrodeposition of a thin film of a mixture of oxides and/or hydroxides comprising, for an $A-B-C_2$ film, at least one element from group 11 and one element from group 13 or, for an $A_2-(D_x,E_{1-x})-C_4$ film, at least one element from group 11, at least one element from group 12 if x>0, and at least one element from group 14 if x<1,
  annealing of the thin film in a reducing atmosphere,
  supply of at least one element from group 16 in order to form an $A-B-C_2$ or $A_2-(D_x,E_{1-x})-C_4$ thin film where $0 \leq x \leq 1$.

Advantageously, the electrodeposition of the elements of groups 11, 12, 13, and 14 in oxide and/or hydroxide form is easier to carry out and allows better control of the final composition than the electrodeposition of these elements in non-oxidized form. In particular, the electrolyte solution is more stable when the oxides are formed in the absence of Se or S elements in solution, and contrary to the electrodeposition of the prior art, the chemical composition of the absorber thin film does not change during the growth of said film.

Advantageously, it is possible to carry out the deposition on large areas by a coating technique that is perfectly established on an industrial level and is highly advantageous for the production of photovoltaic panels on a large scale and at low cost.

A method according to the invention may further comprise one or more of the optional features below, considered individually or in all possible combinations thereof:
  the electrodeposition is carried out at a temperature of at least 5° C. and not greater than 95° C.;
  the annealing in reducing atmosphere is carried out at a temperature of at least 300° C. and not greater than 650° C.;
  the annealing in reducing atmosphere has a duration of at least 20 seconds and not greater than 15 minutes;

prior to the electrodeposition of the thin film, an aqueous solution is prepared containing a mixture of salts of A and B for an A-B-C$_2$ film or a mixture of salt of A, D and/or E for an A$_2$-(D$_x$,E$_{1-x}$)-C$_4$ film, in the presence of at least one oxygen donor species;

the oxygen donor species consists of a nitrate ion, or of dioxygen, or of hydrogen peroxide or of hypochlorite ions;

element A is copper or silver or a mixture of copper and silver and C is selenium or sulfur or a mixture of selenium and sulfur;

the absorber thin film for photovoltaic cells is the A-B-C$_2$ type and B comprises one or more elements selected from indium, gallium, aluminum or mixtures thereof;

the electrodeposition is carried out by imposing a voltage of at least −1.8 V, for example at least −1.0 V, and not greater than −0.5 V, for example not greater than −0.70 V, in comparison with a saturated Hg/Hg$_2$SO$_4$/K$_2$SO$_4$ reference electrode, to an electrode comprising an insulating substrate coated with a film of molybdenum or a current density of between 1 and 30 mA·cm$^{-2}$;

the electrodeposition is carried by imposing a voltage of
  at least −1.8 V and strictly lower than −1.0 V, or
  at least −1.0 V and not greater than −0.70 V, or
  strictly greater than −0.70 V and not greater than −0.5 V,
in comparison with a saturated Hg/Hg$_2$SO$_4$/K$_2$SO$_4$ reference electrode to an electrode comprising an insulating substrate coated with a film of molybdenum or a current density of between 1 and 30 mA·cm$^{-2}$;

the atomic ratio of the elements A and B in the electrolyte solution is at least 0.2, for example at least 0.8, and not greater than 1.5, for example not greater than 1.2;

the atomic ratio of the elements A and B in the electrolyte solution is:
  at least 0.2 and strictly lower than 0.8, or
  at least 0.8 and not greater than 1.2, or
  strictly greater than 1.2 and not greater than 1.5;

the absorber thin film for photovoltaic cells is the A-B-C$_2$ type and B comprises a mixture of indium and gallium, and wherein the ratio of the indium and gallium concentrations in the electrolyte solution is at least 0.2, for example at least 0.8, and not greater than 1.5, for example not greater than 1.2; and the absorber thin film for photovoltaic cells is the A-B-C$_2$ type and B comprises a mixture of indium and gallium, and wherein the ratio of the indium and gallium concentrations in the electrolyte solution is:
  at least 0.2 and strictly lower than 0.8, or
  at least 0.8 and not greater than 1.2, or
  strictly greater than 1.2 and not greater than 1.5.

The invention also relates to a method for manufacturing a solar cell, comprising a method for preparing an absorber thin film for photovoltaic cells according to the invention.

BRIEF DESCRIPTION OF THE DRAWINGS

The invention will be better understood from reading the description that follows, provided exclusively as an example and with reference to the appended drawings in which.

Figure 1:
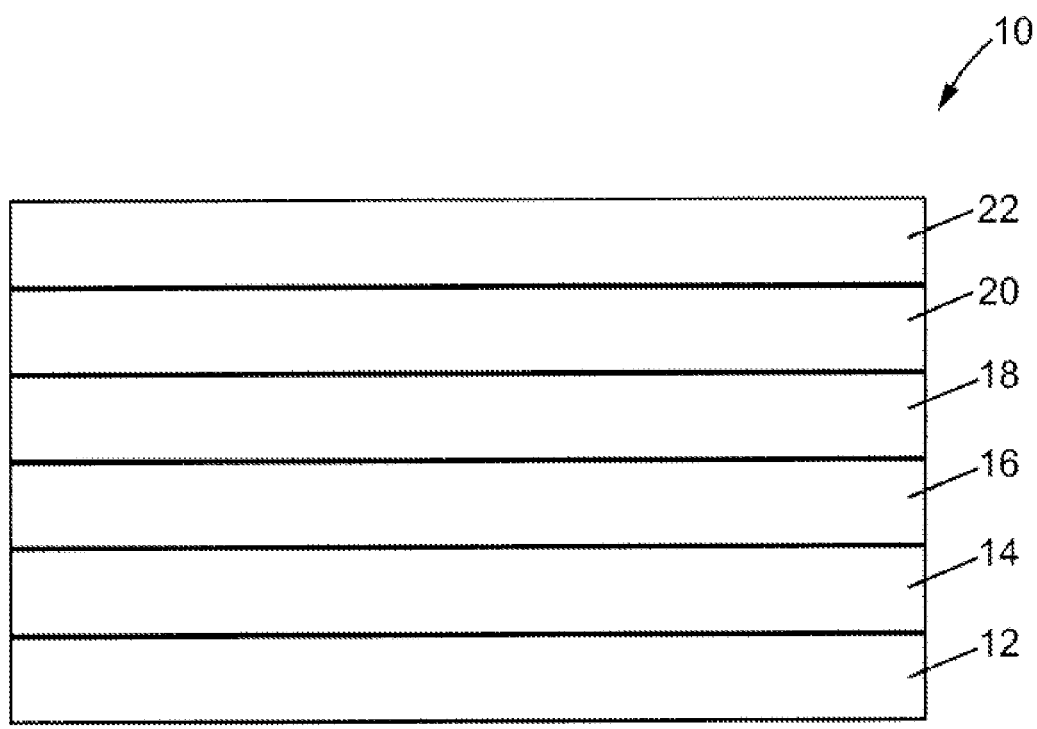
FIG. 1 schematically shows a stack of thin films forming a photovoltaic cell.

For reasons of clarity, the various elements in the figures are not necessarily shown to scale.

DETAILED DESCRIPTION

The invention relates to a method for preparing an absorber thin film for photovoltaic cells. The absorber thin film is based on an A-B-C$_2$ or A$_2$-(D$_x$,E$_{1-x}$)-C$_4$ alloy, where 0≤x≤1 and A is an element or a mixture of elements selected from group 11, B is an element or an element selected from group 13, C is an element or a mixture of elements selected from group 16, D is an element or a mixture of elements selected from group 12 and E is an element or mixture of elements selected from group 14.

According to an embodiment of the invention, A is an element or a mixture of elements selected from copper (Cu) and silver (Ag).

According to an embodiment of the invention, B is an element or a mixture of elements selected from aluminum (Al), gallium (Ga), and indium (In).

According to an embodiment of the invention, C is an element or a mixture of elements selected from sulfur (S) and selenium (Se).

According to an embodiment of the invention, D is an element or a mixture of elements selected from zinc (Zn) and cadmium (Cd).

According to an embodiment of the invention, E is an element or a mixture of elements selected from silicon (Si), germanium (Ge), tin (Sn) and lead (Pb).

According to an embodiment of the invention, the absorber thin film is based on a Cu$_p$Ag$_{1-p}$(In$_x$Ga$_y$Al$_z$)Se$_2$ alloy where 0≤p≤1, 0≤x≤1, 0≤y≤1, 0≤z≤1 and x+y+z=1.

According to an embodiment of the invention, the absorber thin film is based on a Cu(In$_x$Ga$_{1-x}$)Se$_2$ alloy where 0≤x≤1.

According to an embodiment of the invention, the absorber thin film is based on a Cu$_2$(Sn$_x$Zn$_{1-x}$)(Se$_y$S$_{1-y}$)$_4$ alloy, where 0≤x≤1 and 0≤y≤1.

Figure 2:
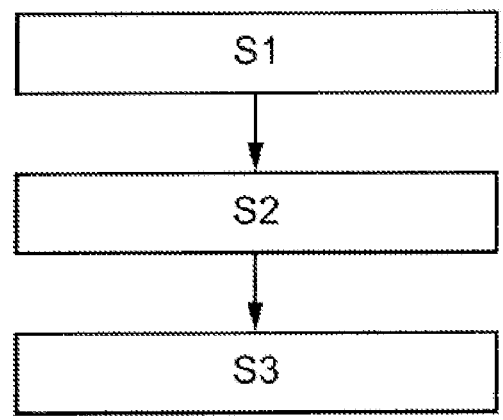
FIG. 2 shows the various steps of a method according to the invention.

As shown in FIG. 2, the method according to the invention comprises:
  a step S1 of electrodeposition,
  a step S2 of annealing in reducing atmosphere, and
  a step S3 of supplying at least one element from group 16.

According to an embodiment of the invention, prior to the electrodeposition step S1, the method comprises a step of preparation of an electrolyte.

Advantageously, the method according to the invention uses the deposition of an oxide film of elements A, B, D or E. This deposition of the oxide and/or hydroxide film may be carried out by electrolysis at low temperature, at least 5° C. and not greater than 95° C., and does not require costly vacuum or vapor deposition equipment.

The electrolyte may, for example, be an aqueous solution containing a mixture of salts of A and B in order to prepare a follow-up of the preparation of an A-B-C$_2$ film or a mixture of salts of A, D and/or E for a $A_2$-$(D_xE_{1-x})$-$C_4$ film. The salts are mixed in the presence of an oxygen donor species, and according to one embodiment, the salts of the elements A, B, D and E may be nitrates. The oxygen donor species may be a nitrate, or even oxygen gas or hydrogen peroxide or hypochlorite ions.

The aqueous solution may also comprise a support electrolyte to improve its conductivity.

Advantageously, the aqueous electrolyte solutions according to the invention are stable and do not have any tendency to precipitation.

The electrodeposition can be carried out by applying a voltage to a deposition electrode in comparison with a reference electrode or a current density. The deposition electrode may comprise an insulating plate, for example, a glass plate coated with a molybdenum film. The reference electrode may be a saturated calomel electrode or a mercury sulfate electrode or an Ag/AgCl electrode.

According to an embodiment, the electrodeposition is carried out at a temperature of at least 5° C. and not greater than 95° C., for example at a temperature of at least 30° C., preferably at least 60° C. and not greater than 83° C., for example substantially equal to 80° C.

According to the embodiment, the element A is copper and the element B is selected from indium, gallium and aluminum or mixtures thereof, the electrodeposition is carried out by imposing on the electrode, in comparison with a saturated mercury sulfate reference electrode, a voltage of at least −1.8 V, for example at least −1 V, and not greater than −0.5 V, for example not greater than −0.70 V. A current density of between 1.0 and 30 mA·cm$^{-2}$ may also be imposed.

The oxide and/or hydroxide film is deposited on the electrode comprising an insulating substrate coated with a molybdenum film in the form of a thin film of which the thickness is controlled by the quantity of electricity exchanged during the reaction, the reaction temperature, and the reaction time.

The deposition speeds are high, about 3.5 microns per hour at 25° C. and more than 10 microns per hour at 80° C.

Typically, the deposition is carried in aqueous solution during a period of about 10 to 20 minutes and leads to the formation of an oxide film having a thickness of between 600 and 2000 nanometers, for example between 800 and 1200 nanometers.

The composition of the deposited absorber film is controlled on the one hand by the salt composition of the aqueous solution and by the voltage or current density imposed on the deposition electrode.

The inventors found that the photovoltaic cells obtained with absorber films comprising A-B-$C_2$ alloys have improved conversion efficiencies when the atomic ratio of the elements A and B in the electrolyte solution is at least 0.2, for example greater than 0.8, and not greater than 1.5, for example not greater than 1.2, for example not greater than 1, for example substantially equal to 1.

For example, in the case of an absorber comprising a $Cu(In_xGa_{1-x})Se_2$ alloy, the inventors observed that the conversion efficiency is improved when the Cu/(In+Ga) atomic ratio is close to 1 and the gallium content: Ga/(In+Ga) is at least 0.2 and not greater than 0.35, for example substantially equal to 0.3.

Figure 3:
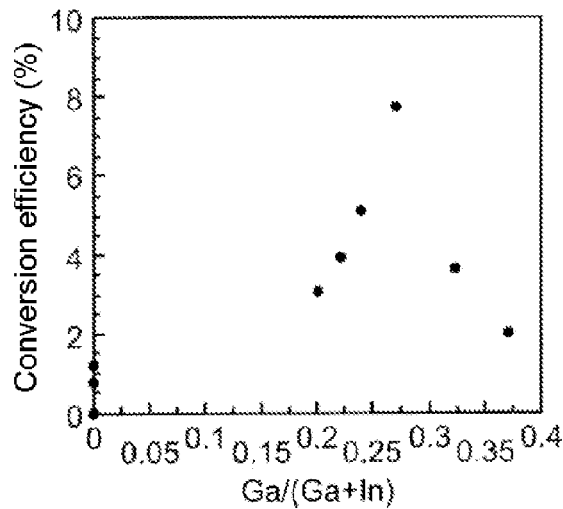
FIG. 3 is a graph illustrating the influence of the gallium content in the absorber thin film on the conversion efficiency of a photovoltaic cell comprising such an absorber thin film.

FIG. 3 illustrates the influence of the gallium content in the $Cu(In_xGa_{1-x})S_2$ absorber film on the conversion efficiency of the photovoltaic cell comprising said absorber film.

It appears that the conversion efficiency is optimal for a gallium Ga(In+Ga) content of between 0.2 and 0.35, preferably substantially equal to 0.3. The inventors observed by X-ray diffraction that the oxide and/or hydroxide deposits have an amorphous appearance.

The method according to the invention further comprises a step of annealing in reducing atmosphere of the oxide thin film obtained during the electrodeposition.

Figure 4:
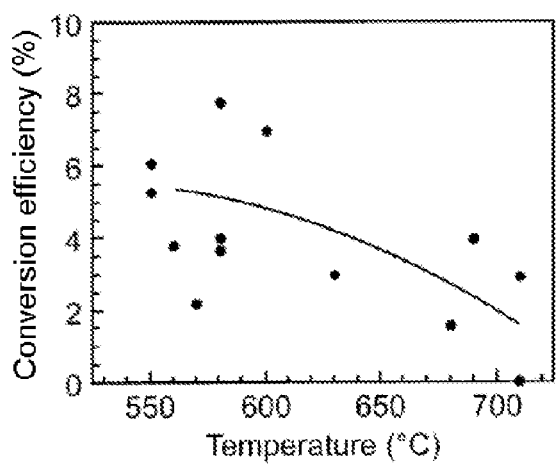
FIG. 4 is a graph illustrating the influence of the annealing time in reducing atmosphere of the absorber thin film on the conversion efficiency of a photovoltaic cell comprising such an absorber thin film.

FIG. 4 illustrates the influence of the temperature of the annealing step in reducing atmosphere on the conversion efficiency of a photovoltaic cell comprising a $Cu(In_xGa_{1-x})S_2$ absorber film, the annealing step being carried out in ethanol atmosphere for 20 seconds.

As shown in FIG. 4, in order to improve the conversion efficiency, it is advantageous for the annealing step in reducing atmosphere to be carried out at a temperature of at least 300° C. and not greater than 650° C., for example at a temperature of at least 500° C. and not greater than 575° C., for example at a temperature substantially equal to 550° C.

According to an embodiment of the invention, the step of annealing in reducing atmosphere may last between 20 seconds and 15 minutes, for example between 20 seconds and 5 minutes.

Figure 5:
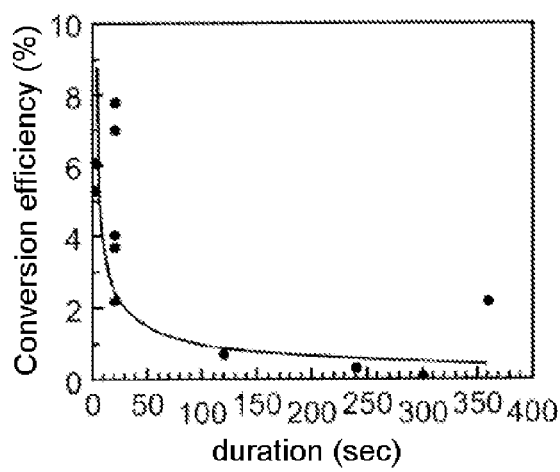
FIG. 5 is a graph illustrating the influence of the annealing temperature in reducing atmosphere of an absorber thin film on the conversion efficiency of a photovoltaic cell comprising such an absorber thin film.

FIG. 5 illustrates the influence of the duration of the annealing step in reducing atmosphere on the conversion efficiency of a photovoltaic cell comprising a $Cu(In_xGa_{1-x})S_2$ absorber film, the annealing step being carried out in ethanol atmosphere at a temperature of 550° C.

As shown in FIG. 5, in order to increase the conversion efficiency, it is advantageous for the annealing step in reducing atmosphere to last between 20 seconds and 50 seconds.

The annealing step in reducing atmosphere can be carried out using a $H_2/N_2$ mixture or alcohol vapors, hydrocarbon vapors or even ammonia vapors.

The annealing step in reducing atmosphere serves to reduce the oxide film to metal alloy.

Figure 6:
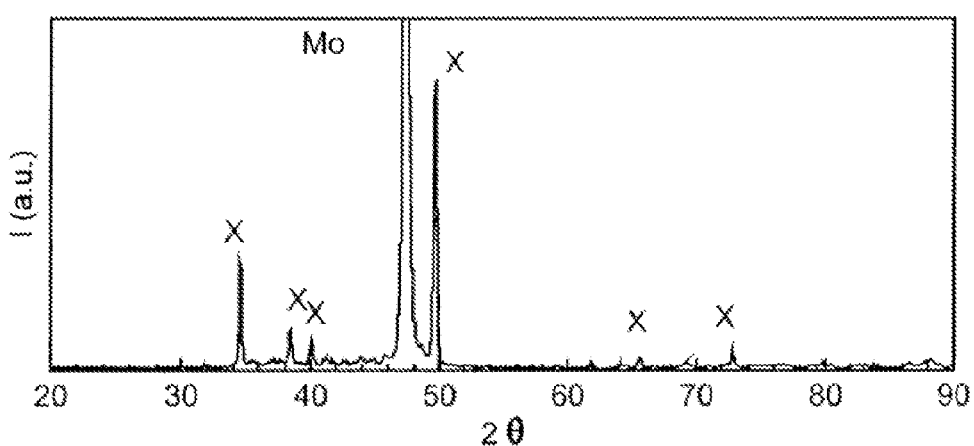
FIG. 6 is an X-ray diffraction diagram of an absorber thin film after annealing in reducing atmosphere.

FIG. 6 is an X-ray diffraction diagram of a deposit of a mixture of copper, gallium and indium oxide after the annealing step in reducing atmosphere. The diffraction diagram shown in FIG. 6 serves to identify a $Cu_9In_4$ and $Cu_9Ga_4$ cubic phase and a large peak corresponding to the molybdenum substrate. The diagram can be indexed as a mixed $Cu_9(In_x, Ga_{1-x})_4$ phase having a cubic structure and an intermediate parameter between that of $Cu_9In_4$ and $Cu_9Ga_4$.

As shown in the diagram in FIG. 6, on completion of the annealing step in reducing atmosphere, all the oxides have been reduced.

The method according to the invention further comprises a step of adding at least one element from group 16 in order to form an A-B-$C_2$ or $A_2$-$(D_x,E_{1-x})$-$C_4$ thin film, where $0 \leq x \leq 1$. For example, the addition step may be a conventional selenization step that leads to the formation of a CIS or CIGS compound.

The invention also relates to a method for manufacturing a solar cell comprising the preparation of an absorber thin film according to the invention and the steps of supplementing the cells with a buffer film of CdS, for example by chemical bath deposition (CBD) and the deposition of the final transparent conductive oxide (TCO) film.

The solar cells can then be characterized conventionally.

Example of Preparation of a Photovoltaic Cell Comprising a $Cu(In_xGa_{1-x})Se_2$ Absorber Film.

A solution of $15 \times 10^{-3}$ mol·l$^{-1}$ copper nitrate, $8 \times 10^{-3}$ mol·l$^{-1}$ indium nitrate and $8 \times 10^{-3}$ mol·l$^{-1}$ gallium nitrate is mixed with a support electrolyte of 0.1 mol·l$^{-1}$ sodium nitrate at a pH of 1.86. The temperature of the solution is set at 80° C.

A deposition electrode consisting of a glass plate coated with a 500 nm thick molybdenum film is used.

An electrolysis is carried out at a voltage difference of −0.825 V between the deposition electrode and a saturated mercury sulfate electrode (saturated $Hg/Hg_2SO_4/K_2SO_4$) for about 8 minutes. The composition of the oxide film analyzed by X-ray fluorescence is 44 atomic % copper, 38 atomic % indium and 18 atomic % gallium, the gallium/(indium+gallium) ratio is therefore 0.32 and the copper/(indium+gallium) ratio is 0.8. The thickness of the oxide film is about 1 micron.

Figure 7:
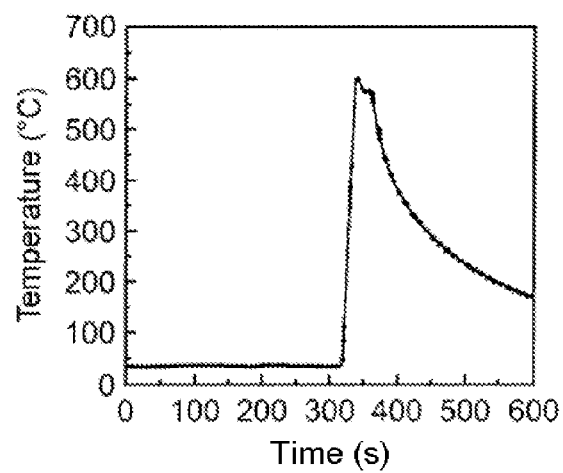
FIGS. 7 and 8 show temperature profiles of the annealing in reducing atmosphere and of the annealing in selenium vapor of an exemplary embodiment of the invention.

A rapid annealing is carried out in ethanol vapor in a lamp furnace for about 20 seconds at 580° C. according to the temperature profile shown in FIG. 7.

After this annealing in reducing atmosphere, a Cu—In—Ga alloy film is obtained having a structure close to $Cu_9(In, Ga)_4$, as confirmed by the diffraction diagram shown in FIG. 6.

Figure 8:
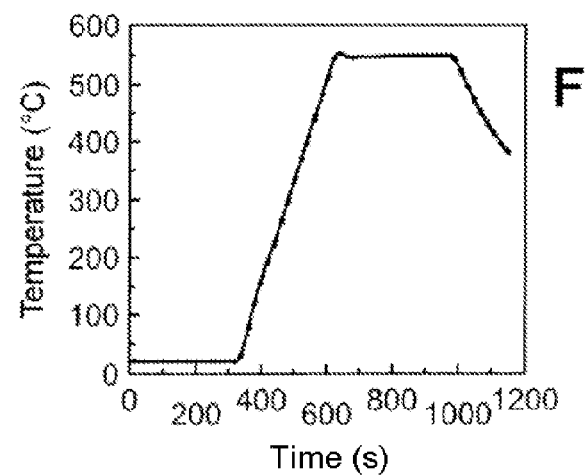

The reducing treatment is followed by a longer annealing under selenium vapor pressure according to the temperature profile shown in FIG. 8.

After this second heat treatment in selenium vapor, the thickness of the film is about 2.8 microns, the film contains about 21 atomic % copper, 54 atomic % selenium, 19 atomic % indium and 7 atomic % gallium, corresponding to a (selenium/copper+indium+gallium) ratio of about 1.2. The film then undergoes a conventional cyanide pickling treatment followed by the deposition of a CdS film by chemical deposition.

A final double film of slightly doped zinc oxide followed by an aluminum-doped zinc oxide film is deposited by cathode sputtering.

The conversion efficiency of the solar cell obtained is measured on the solar simulator in standard conditions (AM 1.5).

The conversion efficiency is about 7.8% on an area of 0.1 $cm^2$, the open circuit voltage is about 0.375 V, the open-circuit current density is about 35 $mA \cdot cm^{-2}$ and the form factor is about 60%. The invention is not limited to the embodiments described and must be interpreted as nonlimiting, and encompassing any equivalent embodiment.

The invention claimed is:

1. A method for preparing an $A-B-C_2$ or $A_2-(D_x,E_{1-x})-C_4$ absorber thin film for photovoltaic cells where $0 \leq x \leq 1$, A is an element or a mixture of elements selected from group 11, B is an element or a mixture of elements selected from group 13, C is an element or a mixture of elements selected from group 16, D is an element or a mixture of elements selected from group 12 and E is an element or a mixture of elements selected from group 14, said method comprising the following successive steps:

electrodeposition of an oxide and/or hydroxide thin film of a mixture of elements in oxide and/or hydroxide form comprising, for an $A-B-C_2$ film, at least one element from group 11 and one element from group 13 or, for an $A_2-(D_x,E_{1-x})-C_4$ film, at least one element from group 11, at least one element from group 12 if $x>0$, and at least one element from group 14 if $x<1$, annealing of the thin film in a reducing atmosphere, supply of at least one element from group 16 in order to form an $A-B-C_2$ or $A_2-(D_x,E_{1-x})-C_4$ thin film where $0 \leq x \leq 1$.

2. The method as claimed in claim 1, wherein the electrodeposition is carried out at a temperature of at least 5° C. and not greater than 95° C.

3. The method as claimed in claim 1, wherein the annealing in reducing atmosphere is carried out at a temperature of at least 300° C. and not greater than 650° C.

4. The method as claimed in claim 1, wherein the annealing in reducing atmosphere has a duration of at least 20 seconds and not greater than 15 minutes.

5. The method as claimed in claim 1, wherein, prior to the electrodeposition of the thin film, an aqueous solution is prepared containing a mixture of salts of A and B for an $A-B-C_2$ film or a mixture of salt of A, D and/or E for an $A_2-(D_x,E_{1-x})-C_4$ film, in the presence of at least one oxygen donor species.

6. The method as claimed in claim 5, wherein the oxygen donor species consists of a nitrate ion, or of dioxygen, or of hydrogen peroxide or of hypochlorite ions.

7. The method as claimed in claim 1, wherein A is copper or silver or a mixture of copper and silver and C is selenium or sulfur or a mixture of selenium and sulfur.

8. The method as claimed in claim 1, wherein the absorber thin film for photovoltaic cells is the $A-B-C_2$ type and B comprises one or more elements selected from indium, gallium, aluminum or mixtures thereof.

9. The method as claimed in claim 8, wherein the electrodeposition is carried by imposing a current density of between 1 and 30 $mA \cdot cm^{-2}$ or a voltage of at least $-1.8$ V and not greater than $-0.5$ V to an electrode comprising an insulating substrate coated with a film of molybdenum and a saturated $Hg/Hg_2SO_4/K_2SO_4$ reference electrode.

10. The method as claimed in claim 8, wherein the atomic ratio of the elements A and B in the electrolyte solution is at least 0.2 and not greater than 1.5.

11. The method as claimed in claim 1, wherein the absorber thin film for photovoltaic cells is the $A-B-C_2$ type and B comprises a mixture of indium and gallium, and wherein the ratio of the indium and gallium concentrations in the electrolyte solution is at least 0.2 and not greater than 1.5.

12. A method for manufacturing a solar cell, comprising the method for preparing an absorber thin film for photovoltaic cells as claimed in claim 1.

* * * * *